United States Patent [19]
McIver

[11] Patent Number: 5,337,216
[45] Date of Patent: Aug. 9, 1994

[54] MULTICHIP SEMICONDUCTOR SMALL OUTLINE INTEGRATED CIRCUIT PACKAGE STRUCTURE

[75] Inventor: Chandler H. McIver, Tempe, Ariz.

[73] Assignee: Square D Company, Palatine, Ill.

[21] Appl. No.: 74,682

[22] Filed: Jun. 9, 1993

Related U.S. Application Data

[63] Continuation of Ser. No. 885,102, May 18, 1992, abandoned.

[51] Int. Cl.⁵ .................................................. H05K 7/00
[52] U.S. Cl. ..................................... 361/728; 361/729; 361/813; 437/218; 437/219
[58] Field of Search ............... 174/52.4; 357/69–70, 357/74–75, 80; 361/392–399, 412, 417, 419–420, 421, 380; 437/218, 219

[56] References Cited

U.S. PATENT DOCUMENTS
3,926,746 12/1975 Hargis ................................. 437/218

FOREIGN PATENT DOCUMENTS
| | | | |
|---|---|---|---|
| 2347442 | 4/1974 | Fed. Rep. of Germany | 361/412 |
| 248453 | 5/1961 | Japan | 437/218 |
| 0047855 | 2/1990 | Japan | 357/74 |
| 2096394 | 10/1982 | United Kingdom | 357/75 |
| 2160366 | 12/1985 | United Kingdom | 361/412 |

*Primary Examiner*—Gregory D. Thompson
*Attorney, Agent, or Firm*—Michael J. Femal; Richard J. Graefe; Larry I. Golden

[57] ABSTRACT

A semiconductor package houses a plurality of single two terminal semiconductor components. The package is a plastic or ceramic small outline integrated circuit package and is adapted for surface mounting. Each semiconductor element is in a die form and one terminal is directly bonded to one of the external leads. The other terminal is bonded to a jumper that in turn is bonded to the other lead. The resultant package is encapsulated and the external leads are formed for surface mounting. V-shaped grooves formed on the top and bottom of the package separate each semiconductor component and provide a means to separate each or a combination of individual semiconductor components from the package by allowing them to be snapped apart at the V-groove. The resultant package has a very low profile that allows it to be used in thin profile, high density electronic assemblies.

15 Claims, 3 Drawing Sheets

MULTICHIP SEMICONDUCTOR SMALL OUTLINE INTEGRATED CIRCUIT PACKAGE STRUCTURE

This application is a continuation of application Ser. No. 07/885,102, filed on May 18, 1992 abandoned.

DESCRIPTION

1. Technical Field

Applicants' invention relates generally to multichip semiconductor devices, and more particularly to a plastic small outline integrated circuit package containing a plurality of separate and independent two terminal devices for mounting on a printed circuit board assembly. This type of package provides a means of eliminating defective elements without having to discard functional components.

2. Background Art

Packages containing a plurality of two-leaded semiconductor devices are well known. In many instances these devices are packaged in a small outline integrated circuit (SOIC) package for mounting onto printed circuit board assemblies. These packages usually contain from one to eight individual and separate devices. In the past it has been the practice to discard the complete (SOIC) package if one of the individual semiconductor devices was found to be defective during final test after encapsulation. The present invention eliminates these and other problems without loss of performance or reliability.

Summary of the Invention

Accordingly, the principal object of the present invention is to provide a SOIC package for housing multiple, two terminal semiconductor components. The package can be adapted for use with surface mount or through hole technology.

It is a further object of the invention to provide a package that allows defective semiconductor components to be separated from the SOIC package, resulting in a smaller but functional SOIC package or packages.

In one embodiment of the invention, a semiconductor die is directly attached to one of the leads, internal to the package and the other lead of the two terminal device is connected to the top of the semiconductor die by means of a preformed, conductive metal alloy strap or by wire bonding, also internal to the package. The resultant device is encapsulated to complete the package.

In the preferred embodiment, each individual semiconductor component is separated by a V-groove formed on the top and the bottom of the semiconductor device during the encapsulation process of an assembled lead frame. These grooves provide the means for separating the defective devices from the functional ones by allowing them to be snapped apart at the V-groove.

Other features and advantages of the invention will be apparent from the following specification taken in conjunction with the accompanying drawings in which there is shown a preferred embodiment of the invention. Reference is made to the claims for interpreting the full scope of the invention which is not necessarily represented by such embodiment.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1:
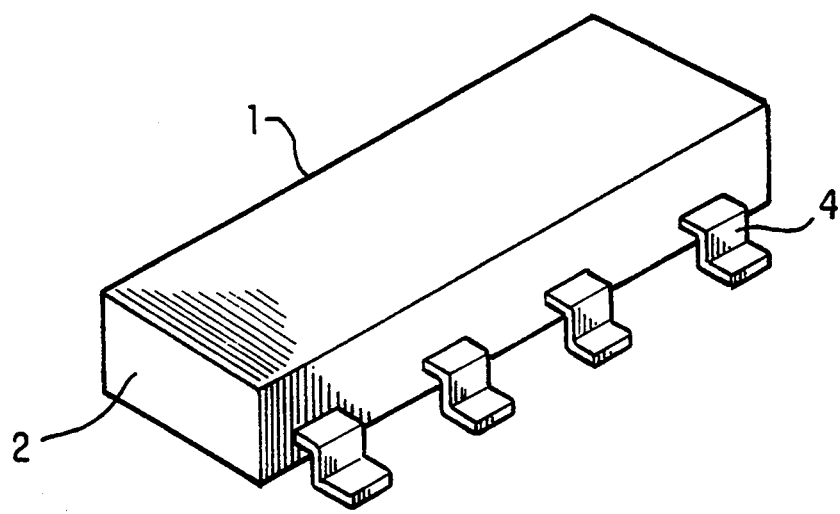
FIG. 1 is an isometric view of a quad SOIC package constructed according to the prior art.

FIG. 1 illustrates a quad SOIC package 1 housing four separate two terminal semiconductor devices constructed according to the prior art. It consists of a plastic body 2 and external mounting leads 4. The leads 4 could be surface mountable as shown or leads of the type suitable for through hole circuit board soldering.

Figure 2:
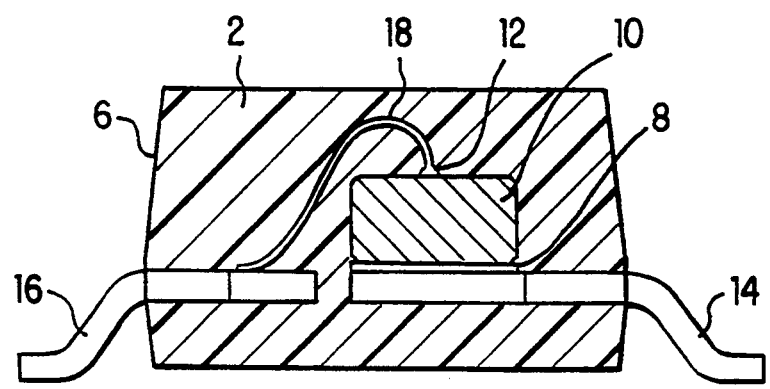
FIG. 2 discloses a section view of FIG. 1 to illustrate the details of bonding the various elements comprising a typical, single, two terminal semiconductor device.

The construction of a typical two terminal semiconductor device is disclosed by the cutaway, cross sectional view of Fig 2. The semiconductor device 6 could be a transient voltage suppressor (TVS) diode. The TVS diode can be a silicon junction suppressor which includes a silicon semiconductor die 10 having a PN junction and metallized surface areas for making electrical contact to both sides of the PN junction. These metallized areas act as the electrodes for attaching the die 10 to the lead 14 and the jumper 18. The cathode 8, which is on the bottom portion of a semiconductor die 10, has an electrode which is electrically bonded to the lead 14. The electrode of the anode 12, which is on the top portion of the die 10, is electrically bonded to a conductive metal jumper 18, which in turn is electrically bonded to the lead 16, completing the circuit. Wire bonding could be used in place of the metal jumper 18. Other types of two terminal devices could also be attached in a similar manner. These could be, but are not restricted to, zener diodes, varistors, resistors, and thin film capacitors.

The bottom of semiconductor die 10 has a metallized surface for electrically bonding to the lead 14. Various die bonding and soldering techniques are very well known in the manufacturing of semiconductors. One end of jumper 18 is bonded to the metallized top of semiconductor die 10 by the same technique of solder bonding. The other end of jumper 18 is bonded to the lead 16 in similar fashion. The material for jumper 18 is selected to have a coefficient of thermal expansion that minimizes the stresses that are present at the bonding areas during the thermal cycling of the semiconductor device 6 during normal operation.

Figure 3:
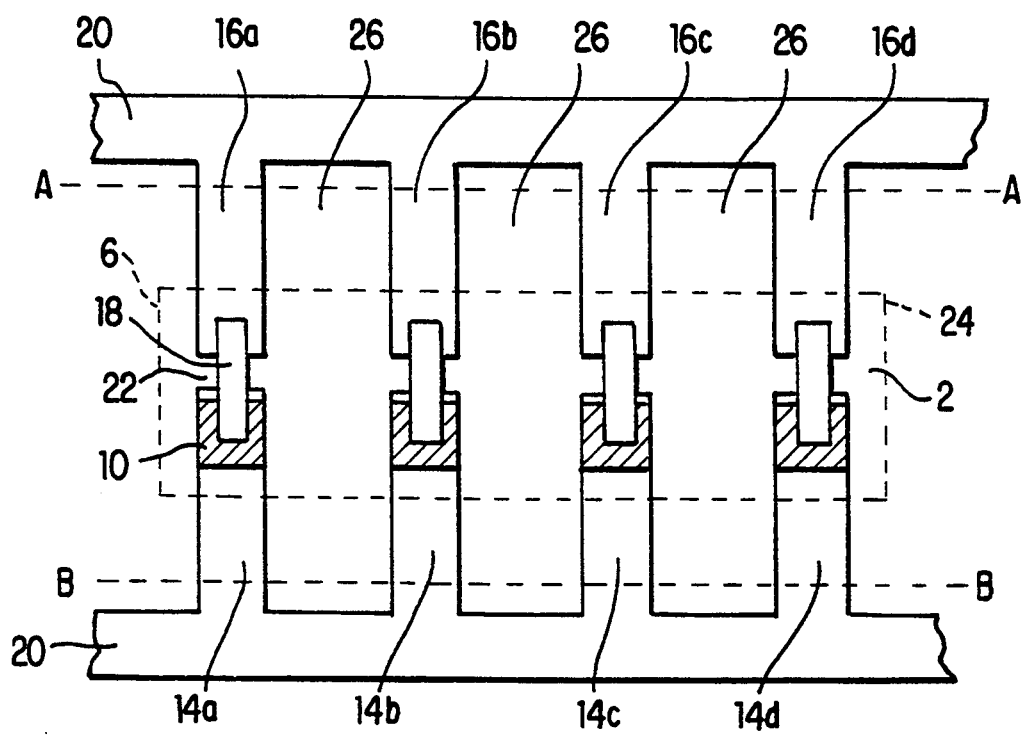
FIG. 3 is a top view of a section of a typical lead frame assembly constructed according to the prior art.

Referring now to FIG. 3, details of the formation of the leads 14 and 16 are given. Partial view of lead frame 20 shows a configuration for assembling multiple quad packages 2 of TVS diodes or other types of two terminal devices. Leads 14a–d and 16a–d are axially aligned and opposite of each other. A gap 26 of approximately 10–50 mils separates lead 14a from 14b, 14b from 14c, and 14c from 14d. Leads 16a–d are separated in a similar manner. A narrow gap 22 of approximately 5 mils separates the inner ends of leads 14a–d from the inner ends of leads 16a–d, respectively. The outer ends of leads 14a–d and 16a–d are attached to the lead frame 20. The lead frame 20 can be made from any type of highly conductive metal material commonly used in making SOIC packages for integrated circuits. The inner ends of leads 14a–d and 16a–d are selectively silver plated to provide a suitable bonding or soldering surface for attaching the semiconductor die 10 and the jumper 18.

After the completion of soldering of the semiconductor die 10 to the lead 14a and the jumper 18, and the jumper 18 to the other lead 16a, and similarly for the remaining leads 14b–d and 16b–d; the plastic encapsulation material 2 is forme around the structure as indicated by the dotted area 24 and as illustrated in FIG. 1. The encapsulation process is very well known and therefore is not detailed herein. After the package is formed, the lead frame 20 is clipped off at A—A and B—B. The remaining portions of the leads 14a–d and 16a–d that extend beyond the encapsulation material 2 can be formed into the common gull wing shape as shown in FIG. 2. The formed leads provide the means for surface mounting the completed package to a printed circuit board. The leads allow the completed assembly to be raised slightly above the printed circuit board. This package can be adapted for use with high volume, surface mount assembly operations. They can be housed in either tape and reel or tube handling formats.

Figure 4:
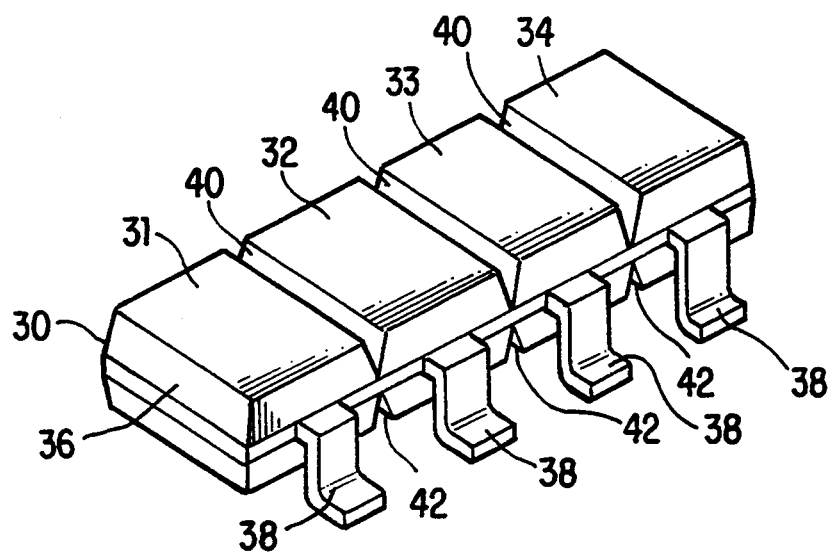
FIG. 4 is an isometric view of a quad SOIC package constructed according to the present invention.

FIG. 4 illustrates a quad DIP package 30 housing four separate two terminal semiconductor devices 31–34 constructed according to the preferred embodiment. It consists of a plastic body 36 and external mounting leads 38. The leads 38 could be surface mountable as shown or leads of the type suitable for through hole circuit board soldering. Separating semiconductor devices 31 from 32, 32 from 33, and 33 from 34 are V-shaped grooves 40 on the top of device 30 and V-shaped grooves 42 on the bottom of device 30. V-shaped grooves 40 and 42 are formed during the encapsulation process of the lead frame to be detailed below.

Figure 5:
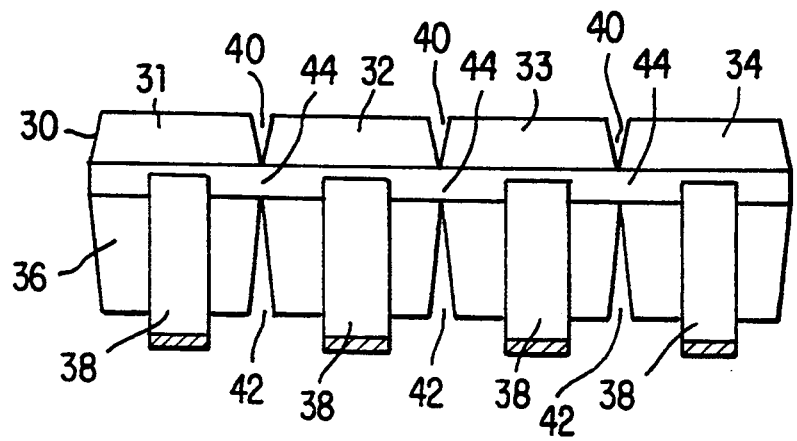
FIG. 5 is side view of the quad SOIC package of FIG. 5.

The side view of FIG. 5 provides greater detail of the construction of the quad SOIC package 30. The thickness of the material 44 between the V-grooves 40 and the V-grooves 42 is such as to provide sufficient strength to keep device 30 intact. However, little effort is required to snap apart and separate device 34 from devices 31–33 or any other combination of separations. Thus, a means is provided that will allow for separation of defective devices from functional devices. A quad package with one defective device could become one three pack or one single and one dual package. In the past, the quad package would have been discarded completely.

Figure 6:
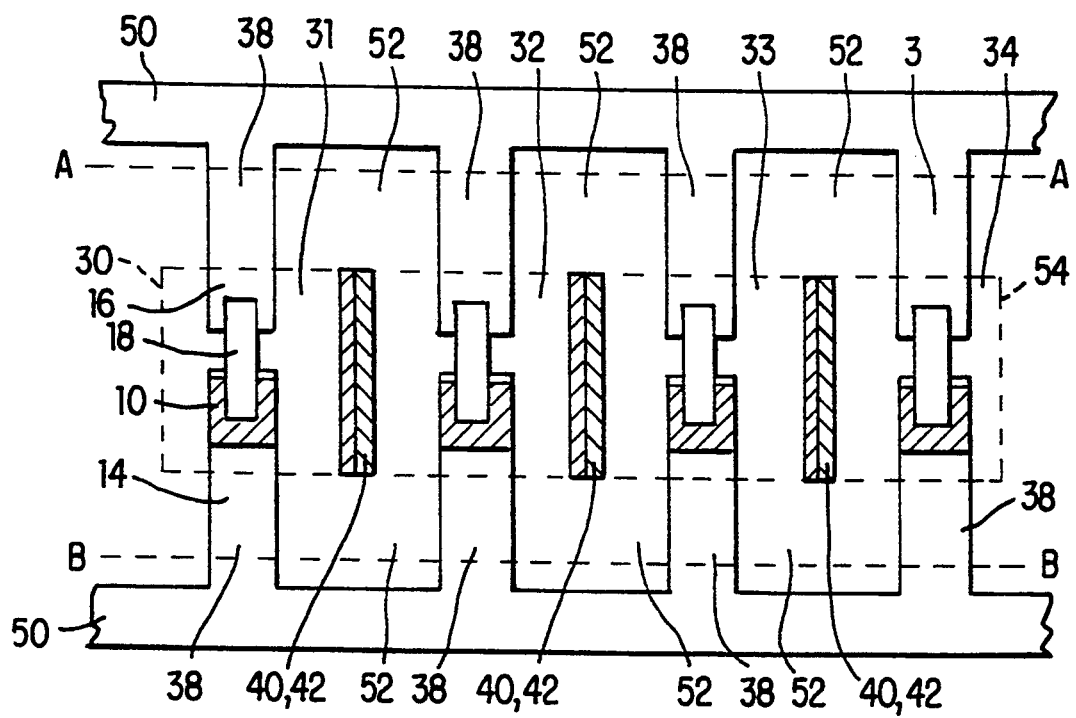
FIG. 6 is a top view of a section of a typical lead frame assembly constructed according to the present invention.

FIG. 6 details the formation of the quad SOIC package 30 of FIG. 5. The description of all the elements of FIG. 3 are applicable with the exception of the distance 52 between adjacent leads 38. Whereas the gap 26 is approximately 10–50 mils between adjacent leads 14a and 14b, the gap 52 will be approximately 15 mils wider between adjacent leads 38. This additional gap 52 is to allow for the addition of the upper and lower V-grooves 40, 42 respectively. As a consequence, the overall dimension of a typical quad SOIC package constructed according to the present invention increases appropriately. After the completion of soldering or bonding of the semiconductor die 10 to the lead 14 and the jumper 18, and the jumper 18 to the other lead 16 for each individual semiconductor device 31, 32, 33 and 34, a plastic encapsulation material 2 is formed around the structure as indicated by the dotted area 54 and as illustrated in FIG. 4. During the encapsulation process V-grooves 40 and 42 are molded into the upper and lower surfaces. As noted above, the encapsulation process is very well known and therefore will not be detailed herein. After the package is formed, the lead frame 50 is clipped off at A—A and B—B. The remaining portions of the leads 14 and 16 that extend beyond the encapsulation material 2 can be formed into the common gull wing shape as shown in FIG. 4 for surface mounting the completed package to a printed circuit board.

While the specific embodiments have been illustrated and described, numerous modifications are possible without departing from the scope or spirit of the invention. Whereas a quad SOIC package has been described, the structure disclosed could be extended to include any number of two terminal devices packaged in a multichip SOIC package. Likewise, the individual semiconductor device could be a three or more terminal device. The main requirement is that each individual semiconductor device is self contained so that it can function alone when separated from the rest of the semiconductor elements.

We claim:

1. A multichip small outline integrated circuit package enclosing a plurality of two terminal semiconductor devices comprising:

a) a plurality of semiconductor elements, each of said plurality of semiconductor elements for each of said plurality of two terminal semiconductor devices and having first and second electrodes;

b) a lead frame with multiple and parallel pairs of leads, each of said multiple pairs of leads for each of said plurality of semiconductor devices and including first and second leads axially aligned and having an inner portion and an outer portion and wherein said first electrodes of said plurality of semiconductor elements are bonded to said inner portions of said first leads and said second electrodes of said plurality of semiconductor elements are coupled to said inner portions of said second leads;

c) a rectangular package body having a top, a bottom, and four sides encapsulating said plurality of semiconductor elements and said inner portions of said first and second leads and wherein said outer portions of said first and second leads extend outwardly from said package body;

d) a first plurality of parallel grooves formed across the top of said package body;

e) a second plurality of parallel grooves formed across the bottom of said package body wherein said second plurality of parallel grooves are aligned with said first plurality of parallel grooves to form an area of division between each of said plurality of two terminal semiconductor devices; and f) wherein said area of division provides a snap dart means of dividing said multichip small outline integrated circuit package into a plurality of smaller units of two terminal semiconductor devices without requiring the use of cutting or manufacturing tools by an end user.

2. The multichip small outline integrated circuit package of claim 1 wherein each said two terminal semiconductor devices is a transient voltage suppressor diode.

3. The multichip small outline integrated circuit package of claim 1 wherein each said two terminal semiconductor devices is a zener diode.

4. The multichip small outline integrated circuit package of claim 1 wherein each of said two terminal semiconductor devices is a rectifier diode.

5. The multichip small outline integrated circuit package of claim 1 wherein each of said two terminal semiconductor devices is a resistor.

6. The multichip small outline integrated circuit package of claim 1 wherein each of said two terminal semiconductor devices is a thin film capacitor.

7. The multichip small outline integrated circuit package of claim 1 wherein said semiconductor element is a varistor.

8. The multichip small outline integrated circuit package of claim 1 wherein said rectangular package body is encapsulated with a plastic material.

9. The multichip small outline integrated circuit package of claim 1 wherein said rectangular package body is encapsulated with a ceramic material.

10. The multichip small outline integrated circuit package of claim 1 wherein said outer portions of said multiple pairs of leads are formed with mounting pads for surface mounting said package to a printed circuit board.

11. The multichip small outline integrated circuit package of claim 1 wherein said first and said second plurality of parallel grooves are V-shaped.

12. A multichip SOIC package enclosing a plurality of semiconductor devices comprising:
   a) a plurality of semiconductor elements, each of said plurality of semiconductor elements for each of said plurality of semiconductor devices and including multiple electrodes;
   b) a lead frame with multiple and parallel sets of leads, each of said multiple sets of leads for each of said plurality of semiconductor devices and including a plurality of leads axially aligned and having an inner portion and an outer portion and means for electrically coupling each of said multiple electrodes to said inner portions of each of said plurality of leads;
   c) a rectangular package body having a top, a bottom, and four sides encapsulating said plurality of semiconductor elements and said inner portions of said multiple sets of leads and wherein said outer portions of said multiple sets of leads extend outwardly from said package body; and
   d) means having a first and second plurality of parallel and opposing grooves formed across the top and bottom of said package body respectively, for dividing said multichip SOIC package into a plurality of smaller units of semiconductor devices to form an area of division between each plurality of semiconductor elements wherein the elements can be snapped apart by an end user without requiring the use of tools.

13. The multichip SOIC package of claim 12 wherein said plurality of semiconductor devices are two terminal devices.

14. The multichip SOIC package of claim 12 wherein said plurality of semiconductor devices are three terminal devices.

15. The multichip SOIC package of claim 12 wherein said outer portions of said multiple sets of leads are formed with mounting pads for surface mounting said package to a printed circuit board.

* * * * *